US009125328B2

(12) United States Patent
Chung et al.

(10) Patent No.: US 9,125,328 B2
(45) Date of Patent: *Sep. 1, 2015

(54) MULTICHIP PACKAGE STRUCTURE AND METHOD OF MANUFACTURING THE SAME

(75) Inventors: Chia-Tin Chung, Miaoli County (TW); Chao-Chin Wu, Taipei (TW); Fang-Kuei Wu, Taoyuan County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 409 days.

This patent is subject to a terminal disclaimer.

(21) Appl. No.: 13/425,692

(22) Filed: Mar. 21, 2012

(65) Prior Publication Data

US 2013/0188349 A1    Jul. 25, 2013

(30) Foreign Application Priority Data

Jan. 19, 2012    (TW) .............................. 101102181 A

(51) Int. Cl.
| | |
|---|---|
| *F21V 7/00* | (2006.01) |
| *H05K 3/28* | (2006.01) |
| *H01L 33/54* | (2010.01) |
| *H01L 33/60* | (2010.01) |

(52) U.S. Cl.
CPC ................ *H05K 3/285* (2013.01); *H01L 33/54* (2013.01); *H01L 33/60* (2013.01); *H05K 3/284* (2013.01); *H05K 2201/10106* (2013.01); *H05K 2201/2054* (2013.01); *Y10T 29/49146* (2015.01)

(58) Field of Classification Search
CPC ..... H01L 33/54; H01L 33/60; H01L 25/0753; H01L 33/642; H01L 2933/0075; H01L 2224/48091; H05K 2201/2054; H05K 3/285; H05K 2201/10106; H05K 3/284
USPC ............ 257/88, 40; 438/46; 362/235; 29/841
See application file for complete search history.

(56) References Cited

U.S. PATENT DOCUMENTS

| | | | | |
|---|---|---|---|---|
| 6,646,039 | B2 * | 11/2003 | Li et al. ......................... | 524/492 |
| 7,521,728 | B2 * | 4/2009 | Andrews ........................ | 257/100 |
| 2011/0001152 | A1 * | 1/2011 | Chung et al. .................... | 257/98 |
| 2011/0241035 | A1 * | 10/2011 | Chung et al. .................... | 257/88 |

* cited by examiner

*Primary Examiner* — Kenneth Parker
*Assistant Examiner* — Bo Fan
(74) *Attorney, Agent, or Firm* — Li & Cai Intellectual Property (USA) Office

(57) ABSTRACT

A method of manufacturing a multichip package structure includes: providing a substrate body; placing a plurality of light-emitting chips on the substrate body, where the light-emitting chips are electrically connected to the substrate body; surroundingly forming surrounding liquid colloid on the substrate body to surround the light-emitting chips; naturally drying an outer layer of the surrounding liquid colloid at a predetermined room temperature to form a semidrying surrounding light-reflecting frame, where the semidrying surrounding light-reflecting frame has a non-drying surrounding colloid body disposed on the substrate body and a dried surrounding colloid body totally covering the non-drying surrounding colloid body; and then forming a package colloid body on the substrate body to cover the light-emitting chips, where the semidrying surrounding light-reflecting frame contacts and surrounds the package colloid body.

5 Claims, 11 Drawing Sheets

MULTICHIP PACKAGE STRUCTURE AND METHOD OF MANUFACTURING THE SAME

BACKGROUND OF THE INVENTION

1. Field of the Invention

The instant disclosure relates to a multichip package structure and a method of manufacturing the same, and more particularly, to a multichip package structure and a method of manufacturing the same for increasing the light-emitting efficiency and the light-projecting angle.

2. Description of Related Art

The invention of the lamp greatly changed the style of building construction and the living style of human beings, allowing people to work during the night. Without the invention of the lamp, we may stay in the living conditions of ancient civilizations.

The LED lamp has a plurality of LED chips and a white frame surrounding the LED chips for increasing the light-emitting efficiency of the LED lamp. However, the white frame is manufactured by a predetermined frame mold, thus the manufacturing cost is increased. In addition, when the shape of the white frame needs to be changed, the frame mold also needs to be changed according to the new shape of the white frame, thus the shape of the frame mold follows the shape of the white frame. Hence, when a new white frame is created for a new product, a new frame mold needs to be developed.

SUMMARY OF THE INVENTION

One aspect of the instant disclosure relates to a multichip package structure and a method of manufacturing the same. The multichip package structure includes a semidrying surrounding light-reflecting frame formed without using any frame mold.

One of the embodiments of the instant disclosure provides a multichip package structure, comprising: a substrate unit, a light-emitting unit, a frame unit and a package unit. The substrate unit includes a substrate body. The light-emitting unit includes a plurality of light-emitting chips disposed on the substrate body and electrically connected to the substrate body. The frame unit includes a semidrying surrounding light-reflecting frame surroundingly disposed on the substrate body, wherein the light-emitting chips are surrounded by the semidrying surrounding light-reflecting frame, and the semidrying surrounding light-reflecting frame has a non-drying surrounding colloid body disposed on the substrate body and a dried colloid outer layer totally covering the non-drying surrounding colloid body. The package unit includes a package colloid body disposed on the substrate body to cover the light-emitting chips, wherein the semidrying surrounding light-reflecting frame contacts and surrounds the package colloid body.

Another one of the embodiments of the instant disclosure provides a method of manufacturing a multichip package structure, comprising the steps of: providing a substrate body; placing a plurality of light-emitting chips on the substrate body, wherein the light-emitting chips are electrically connected to the substrate body; surroundingly forming surrounding liquid colloid on the substrate body to surround the light-emitting chips; naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried colloid outer layer totally covering the non-drying surrounding colloid body; and then forming a package colloid body on the substrate body to cover the light-emitting chips, wherein the semidrying surrounding light-reflecting frame contacts and surrounds the package colloid body. Furthermore, after the step of forming the package colloid body, the method further comprises: solidifying the semidrying surrounding light-reflecting frame by natural drying at the predetermined room temperature or curing at a predetermined curing temperature to form a dried surrounding light-reflecting frame.

Yet another one of the embodiments of the instant disclosure provides a method of manufacturing a multichip package structure, comprising the steps of: providing a substrate body; surroundingly forming surrounding liquid colloid on the substrate body; forming a semidrying surrounding light-reflecting frame by naturally drying the surrounding liquid colloid at a predetermined room temperature until the surrounding liquid colloid forms a dried colloid outer layer and a non-drying surrounding colloid body, the dried colloid outer layer completely covering the non-drying surrounding colloid body, and thus the dried colloid outer layer and the non-drying surrounding colloid body forming the semidrying surrounding light-reflecting frame; placing a plurality of light-emitting chips on the substrate body, wherein the light-emitting chips are electrically connected to the substrate body and surrounded by the semidrying surrounding light-reflecting frame; and then forming a package colloid body on the substrate body to cover the light-emitting chips, wherein the semidrying surrounding light-reflecting frame contacts and surrounds the package colloid body. Furthermore, after the step of forming the package colloid body, the method further comprises: solidifying the semidrying surrounding light-reflecting frame by natural drying at the predetermined room temperature or curing at a predetermined curing temperature to form a dried surrounding light-reflecting frame.

Moreover, the semidrying surrounding light-reflecting frame has a convex junction portion or a concave junction portion formed on the top surface of the semidrying surrounding light-reflecting frame. The semidrying surrounding light-reflecting frame is annularly extended from an initial point to a terminal point, and the position of the initial point and the position of the terminal point are substantially overlapping. The semidrying surrounding light-reflecting frame has an arc shape formed on the top surface of the semidrying surrounding light-reflecting frame, the semidrying surrounding light-reflecting frame has a radius tangent and the angle of the radius tangent relative to the top surface of the substrate body is between 40° and 50°, the maximum height of the semidrying surrounding light-reflecting frame relative to the top surface of the substrate body is between 0.3 mm and 0.7 mm, the width of the bottom side of the semidrying surrounding light-reflecting frame is between 1.5 mm and 3 mm, the thixotropic index of the semidrying surrounding light-reflecting frame is between 4 and 6, and the semidrying surrounding light-reflecting frame is formed by mixing inorganic additive with white thermohardening colloid. The substrate unit includes a plurality of positive pads disposed on the top surface of the substrate body and a plurality of negative pads disposed on the top surface of the substrate body, wherein each light-emitting chip has a positive electrode and a negative electrode, the positive electrode of each light-emitting chip corresponds to at least two of the positive pads, and the negative electrode of each light-emitting chip corresponds to at least two of the negative pads. The positive electrode of each light-emitting chip is electrically connected to one of the two corresponding positive pads, and the negative electrode of each light-emitting chip is electrically connected to one of the two corresponding negative pads.

Therefore, the semidrying surrounding light-reflecting frame can be formed on the substrate body without using any frame mold in the instant disclosure.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Referring to FIG. 1 to FIG. 7, where the first embodiment of the instant disclosure provides a method of manufacturing a multichip package structure for increasing the light-emitting efficiency and the light-projecting angle.

Figure 1:
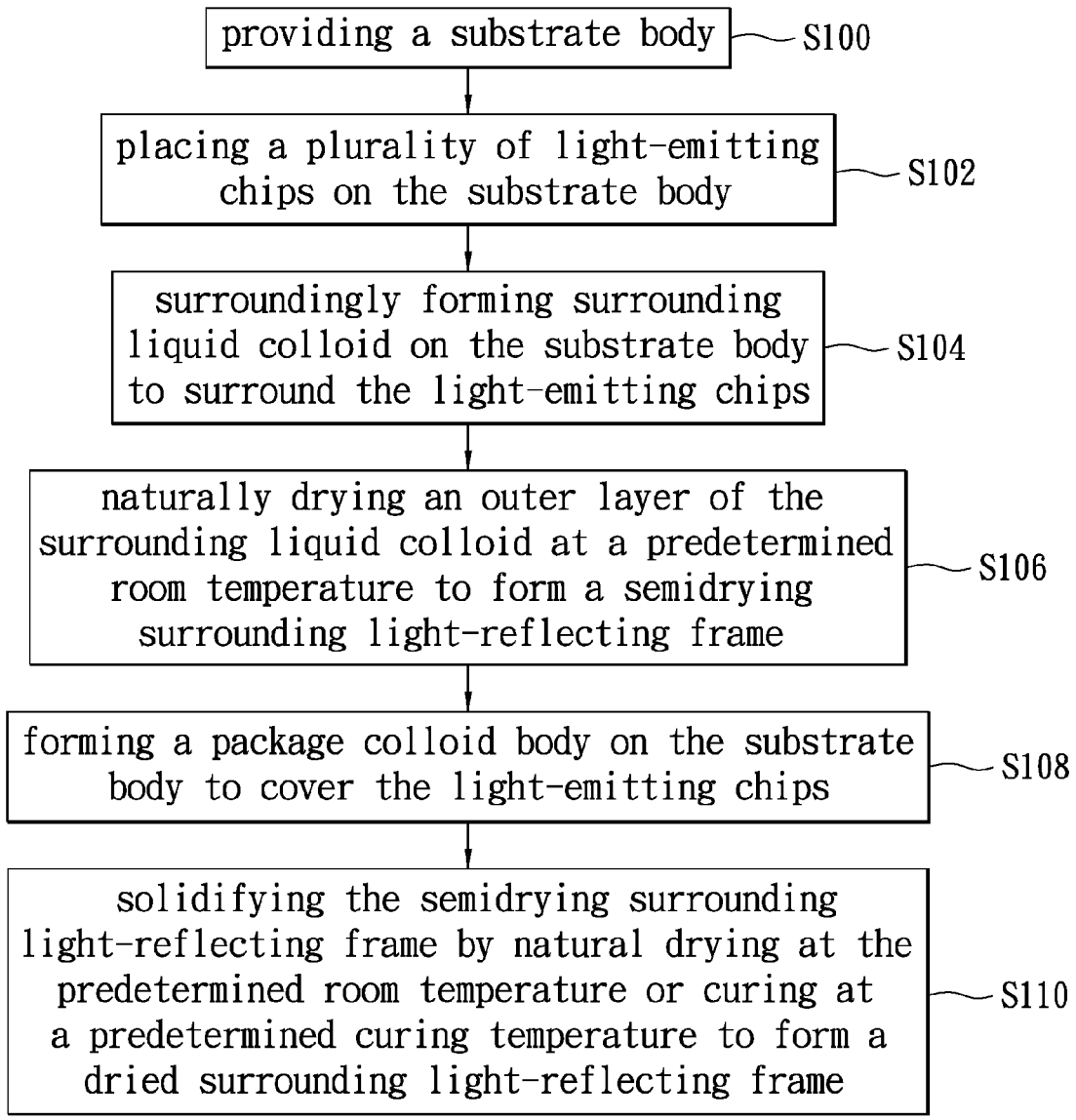
FIG. 1 shows a flowchart of the method of manufacturing a multichip package structure according to the first embodiment of the instant disclosure.

Referring to FIG. 1, the method of manufacturing a multichip package structure of the first embodiment of the instant disclosure, comprising the steps of: providing a substrate body (S100); placing a plurality of light-emitting chips on the substrate body, wherein the light-emitting chips are electrically connected to the substrate body (S102); surroundingly forming surrounding liquid colloid on the substrate body to surround the light-emitting chips (S104); naturally drying an outer layer of the surrounding liquid colloid at a predetermined room temperature to form a semidrying surrounding light-reflecting frame, wherein the semidrying surrounding light-reflecting frame has a non-drying surrounding colloid body disposed on the substrate body and a dried colloid outer layer totally covering the non-drying surrounding colloid body (S106); forming a package colloid body on the substrate body to cover the light-emitting chips, wherein the semidrying surrounding light-reflecting frame contacts and surrounds the package colloid body (S108); and then solidifying the semidrying surrounding light-reflecting frame by natural drying at the predetermined room temperature or curing at a predetermined curing temperature to form a dried surrounding light-reflecting frame (S110).

Figure 2A:
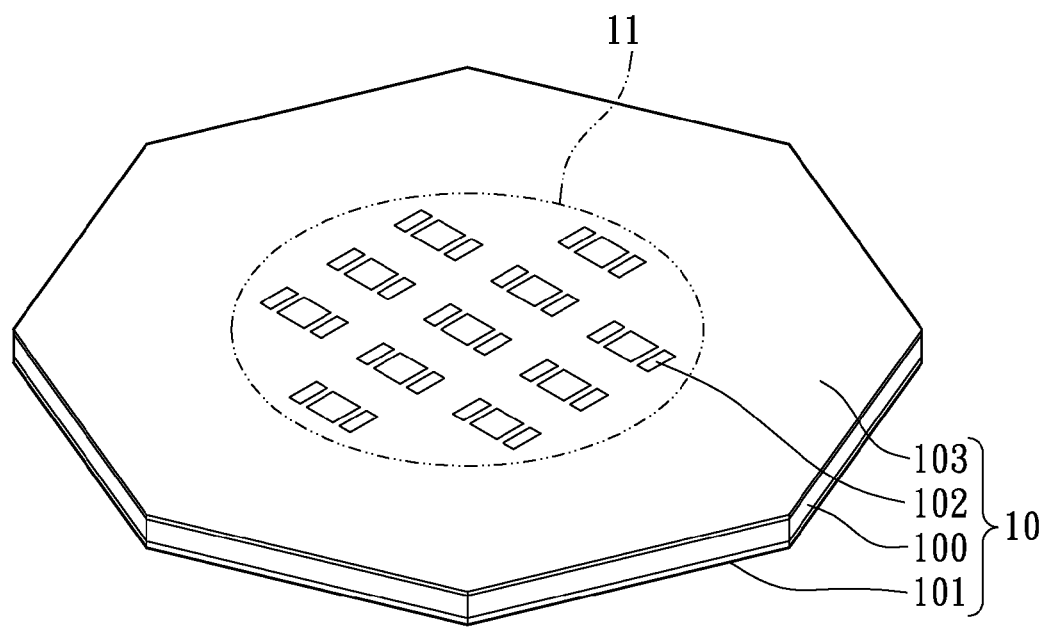
FIG. 2A shows a perspective, schematic view of the step S100 according to the first embodiment of the instant disclosure.
Figure 2B:
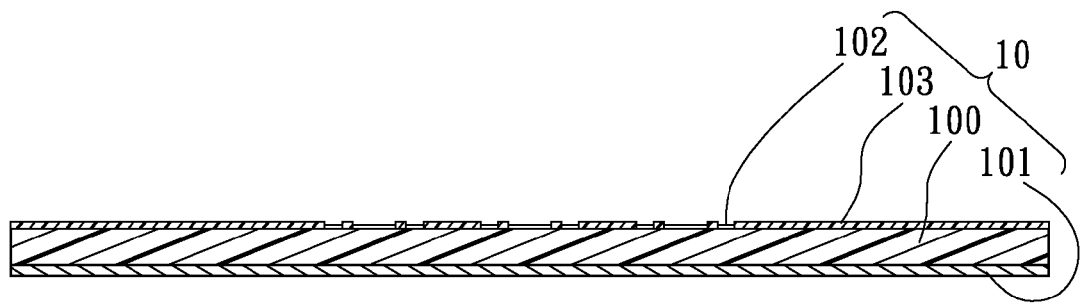
FIG. 2B shows a cross-sectional, schematic view of the step S100 according to the first embodiment of the instant disclosure.

Referring to FIGS. 1, 2A and 2B, the method comprises: providing a substrate body 10 (step S100). For example, the substrate body 10 has a chip-mounting area 11 disposed on the top surface thereof, and the substrate body 10 has a circuit substrate 100, a heat-dissipating layer 101 disposed on the bottom surface of the circuit substrate 100, a plurality of conductive pads 102 disposed on the top surface of the circuit substrate 100, and an insulating layer 103 disposed on the top surface of the circuit substrate 100 to expose the conductive pads 102. Hence, the heat-dissipating efficiency of the circuit substrate 100 can be increased by using the heat-dissipating layer 101, and the insulating layer 103 may be a solder mask for only exposing the conductive pads 102. However, the substrate body 10 used in the first embodiment is merely an example and is not meant to limit the instant disclosure.

Figure 3A:
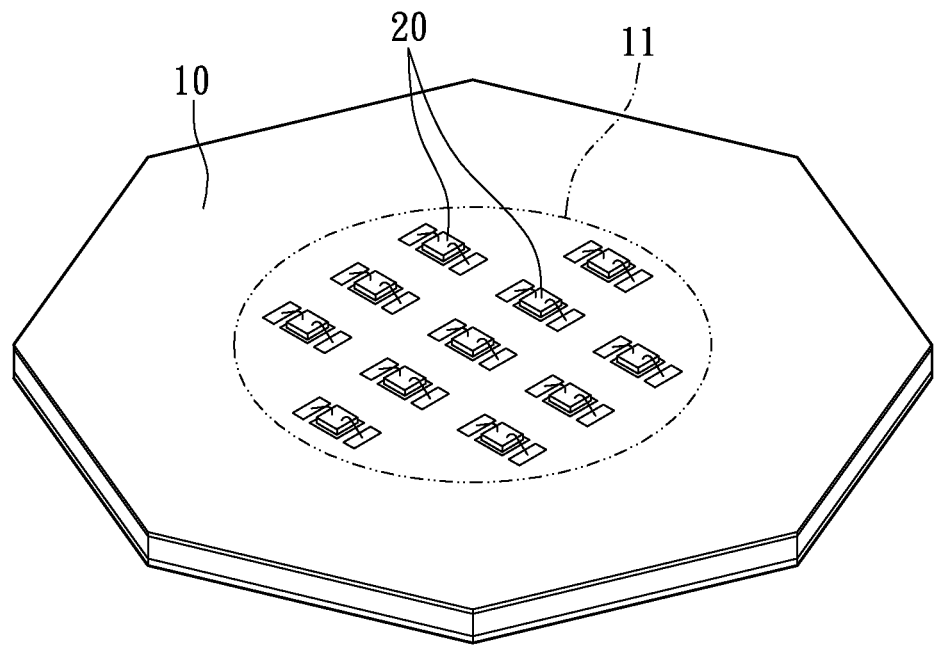
FIG. 3A shows a perspective, schematic view of the step S102 according to the first embodiment of the instant disclosure.
Figure 3B:
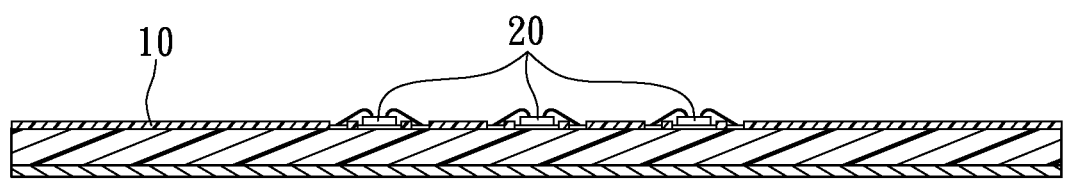
FIG. 3B shows a cross-sectional, schematic view of the step S102 according to the first embodiment of the instant disclosure.

Referring to FIGS. 1, 3A and 3B, the method comprises: placing a plurality of light-emitting chips 20 on the substrate body 10 (step S102), where each light-emitting chip may be a LED chip, and the light-emitting chips 20 are disposed on the chip-mounting area 11 and electrically connected to the substrate body 10. In other words, a predetermined chip-mounting area 11 can be formed on the substrate body 10 in advance, thus the light-emitting chips 20 can be placed on the chip-mounting area 11 of the substrate body 10 to electrically connect to the substrate body 10. In the first embodiment, the light-emitting chips 20 can be electrically connected to the substrate body 10 by wire bonding.

Figure 4A:
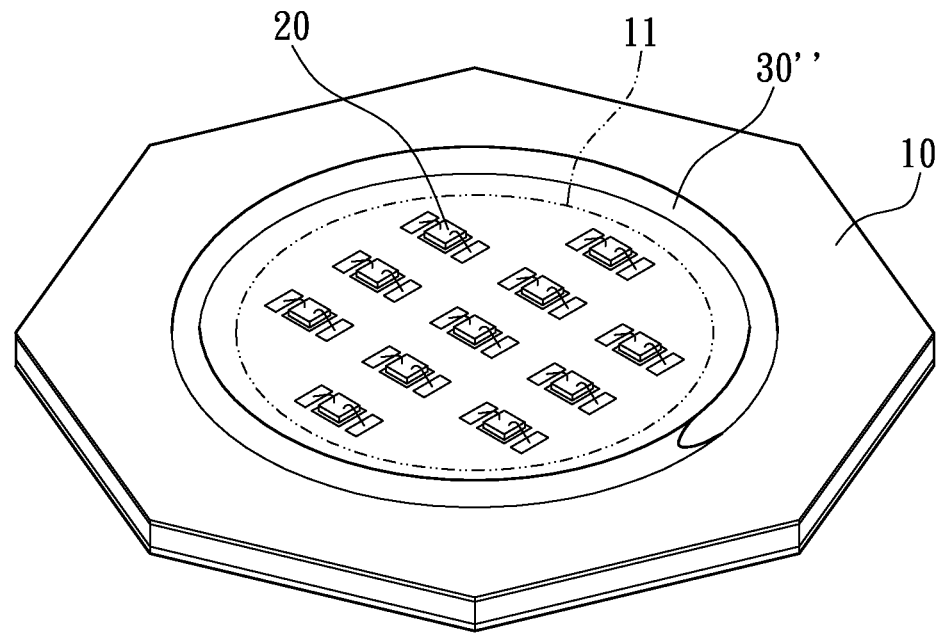
FIG. 4A shows a perspective, schematic view of the step S104 according to the first embodiment of the instant disclosure.
Figure 4B:
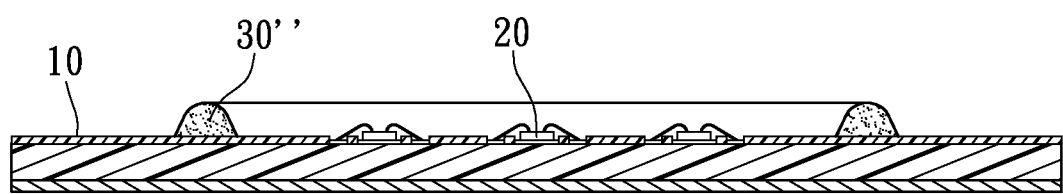
FIG. 4B shows a cross-sectional, schematic view of the step S104 according to the first embodiment of the instant disclosure.

Referring to FIGS. 1, 4A and 4B, the method comprises: surroundingly forming surrounding liquid colloid 30" on the substrate body 10 to surround the light-emitting chips 20 (step S104), where the surrounding liquid colloid 30" can be formed as a predetermined shape (such as a circular shape, a square or a rectangular shape etc.) on the substrate body 10 by coating according to different requirements. The thixotropic index of the surrounding liquid colloid 30" may be between 4 and 6, the pressure of coating the surrounding liquid colloid 30" on the top surface of the substrate body 10 may be between 350 kpa and 450 kpa, and the velocity of coating the surrounding liquid colloid 30" on the top surface of the substrate body 10 may be between 5 mm/s and 15 mm/s. The surrounding liquid colloid 30" can be surroundingly coated on the top surface of the substrate body 10 from an initial point to a terminal point, and the position of the initial point and the position of the terminal point are substantially the same.

Figure 5A:
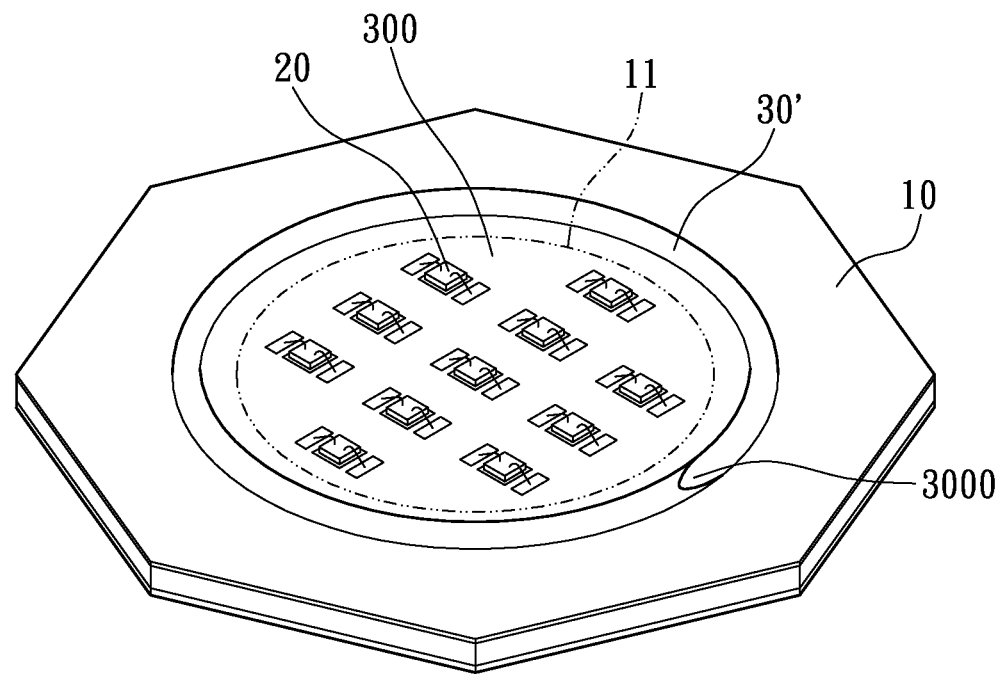
FIG. 5A shows a perspective, schematic view of the step S106 according to the first embodiment of the instant disclosure.
Figure 5B:
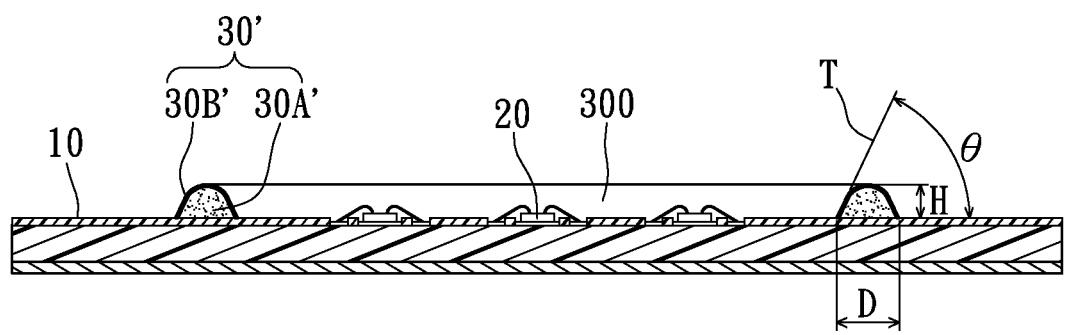
FIG. 5B shows a cross-sectional, schematic view of the step S106 according to the first embodiment of the instant disclosure.

Referring to FIGS. 1, 5A and 5B, the method comprises: naturally drying an outer layer of the surrounding liquid colloid 30" at a predetermined room temperature (such as 25° or 20°~30°)without any curing device to form a semidrying surrounding light-reflecting frame 30', where the semidrying surrounding light-reflecting frame 30' has a non-drying surrounding colloid body 30A' (such as surrounding liquid colloid that is not to be dried) disposed on the substrate body 10 and a dried colloid outer layer 30B' (such as surrounding solidifying colloid that is dried) totally covering the non-drying surrounding colloid body 30A' (step S 106). For example, the semidrying surrounding light-reflecting frame 30' can be extended from an initial point to a terminal point, and the position of the initial point and the position of the terminal point are substantially overlapping, thus the semidrying surrounding light-reflecting frame 30' has a convex or concave junction portion 3000 formed on the top surface thereof. Moreover, the semidrying surrounding light-reflecting frame 30' has an arc shape formed on the top surface thereof. The semidrying surrounding light-reflecting frame 30' has a radius tangent T and the angle θ of the radius tangent T relative to the top surface of the substrate body 10 may be between 40° and 50°. The maximum height H of the semidrying surrounding light-reflecting frame 30' relative to the top surface of the substrate body 10 may be between 0.3 mm and 0.7 mm, and the width D of the bottom side of the semidrying surrounding light-reflecting frame 30' may be between 1.5 mm and 3 mm. The thixotropic index of the semidrying surrounding light-reflecting frame 30' may be between 4 and 6, and the semidrying surrounding light-reflecting frame 30' may be formed by mixing inorganic additive with white thermohardening colloid. In addition, the semidrying surrounding light-reflecting frame 30' surrounds the light-emitting chips 20 to form a colloid position limiting space 300 on the chip-mounting area 11 of the substrate body 10.

Figure 6A:
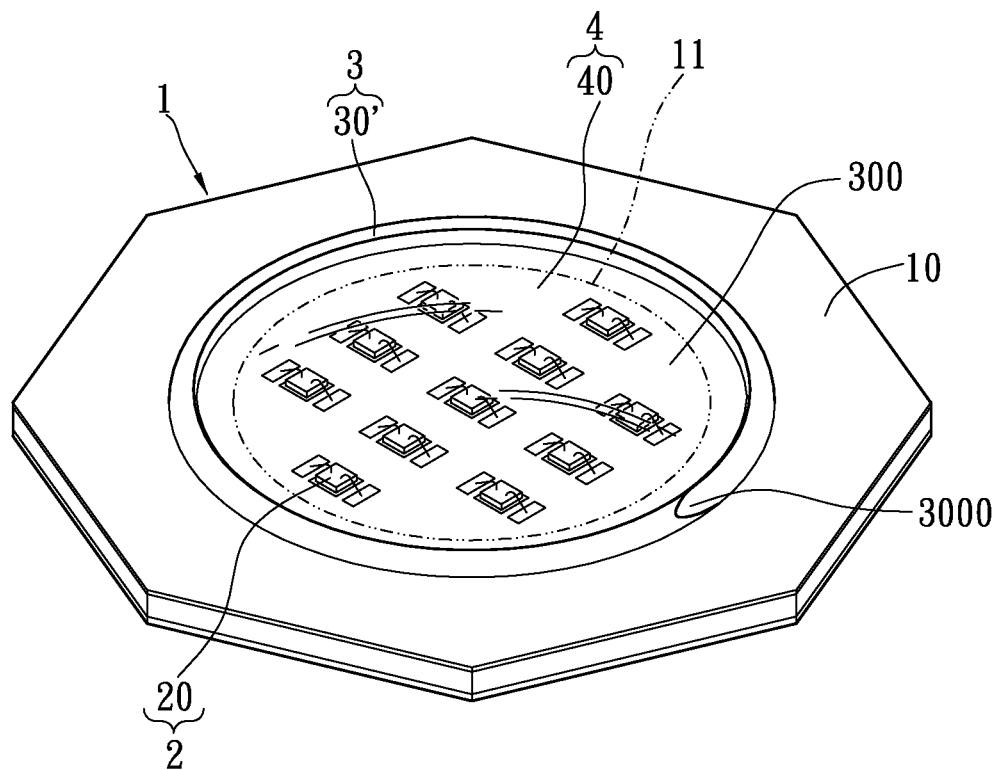
FIG. 6A shows a perspective, schematic view of the step S108 according to the first embodiment of the instant disclosure.
Figure 6B:
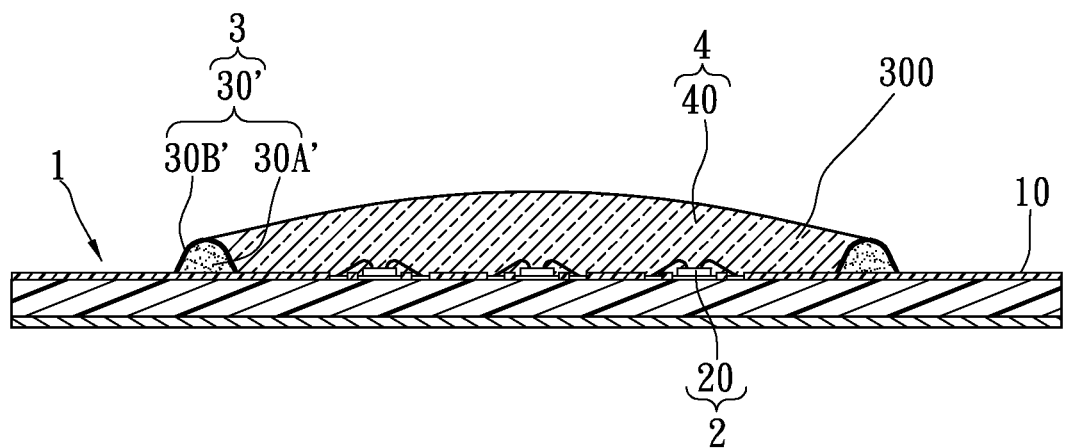
FIG. 6B shows a cross-sectional, schematic view of the step S108 according to the first embodiment of the instant disclosure.

Referring to FIGS. 1, 6A and 6B, the method comprises: forming a package colloid body 40 on the substrate body 10 to cover the light-emitting chips 20, where the semidrying surrounding light-reflecting frame 30' contacts and surrounds the package colloid body 40 (step S108). For example, the package colloid body 40 may be a light-transmitting resin body inside the colloid position limiting space 300, and the package colloid body 40 has a convex top surface.

Hence, referring to FIGS. 6A and 6B and the steps from S100 to S108, the first embodiment of the instant disclosure provides a multichip package structure for increasing the light-emitting efficiency and the light-projecting angle, comprising: a substrate unit 1, a light-emitting unit 2, a frame unit 3 and a package unit 4. The substrate unit 1 includes a substrate body 10. The light-emitting unit 2 includes a plurality of light-emitting chips 20 disposed on the substrate body 10 and electrically connected to the substrate body 10. The frame unit 3 includes a semidrying surrounding light-reflecting frame 30' surroundingly disposed on the substrate body 10. The light-emitting chips 20 are surrounded by the semidrying surrounding light-reflecting frame 30', and the semidrying surrounding light-reflecting frame 30' has a non-drying surrounding colloid body 30A' disposed on the substrate body 10 and a dried colloid outer layer 30B' totally covering the non-drying surrounding colloid body 30A'. The package unit 4 includes a package colloid body 40 disposed on the substrate body 10 to cover the light-emitting chips 20, and the semidrying surrounding light-reflecting frame 30' contacts and surrounds the package colloid body 40.

Figure 7:
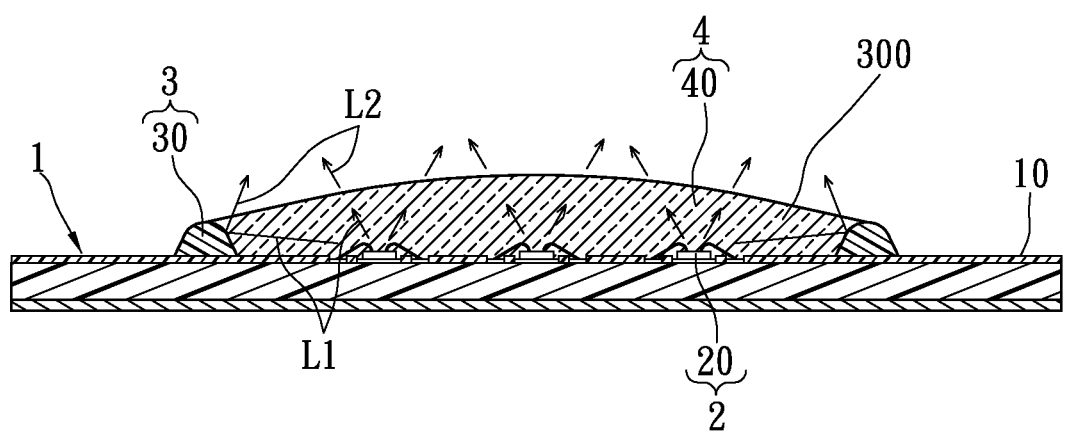
FIG. 7 shows a cross-sectional, schematic view of the step S110 according to the first embodiment of the instant disclosure.

Referring to FIGS. 1 and 7, after the step of forming the package colloid body 40 (the step S108), the method further comprises: solidifying the semidrying surrounding light-reflecting frame 30' by natural drying at the predetermined room temperature or curing at a predetermined curing temperature to form a dried surrounding light-reflecting frame 30 (step S110). For example, in the first embodiment, each light-emitting chip 20 may be a blue LED chip, and the package colloid body 40 may be a phosphor resin body, thus blue light beams L1 generated by the light-emitting chips 20 (the blue LED chips) can pass through the package colloid body 40 (the phosphor resin body) to generate white light beams L2 that are similar to the light source generate by sun lamp.

In conclusion, when the position of the package colloid body 40 can be limited in the colloid position limiting space 300 by using the dried surrounding light-reflecting frame 30, the usage quantity of the package colloid body 40 can be controlled by the designer. In addition, the surface shape and the height of the package colloid body 40 can be adjusted by control the usage quantity of the package colloid body 40, thus light-projecting angle of the white light beams L2 can be adjusted by different surface shapes and heights of the package colloid body 40. Moreover, the blue light beams L1 generated by the light-emitting chips 20 can be reflected by an inner wall of the dried surrounding light-reflecting frame 30 in order to increase the light-emitting efficiency of the multichip package structure of the instant disclosure. In other words, the position of the package colloid body 40 such as the phosphor resin body can be limited inside the colloid position limiting space 300 by using the dried surrounding light-reflecting frame 30, and the shape of the package colloid body 40 can be adjusted by using the dried surrounding light-reflecting frame 30, thus the light-emitting efficiency and the light-projecting angle of the multichip package structure of the instant disclosure can be increased.

[Second Embodiment]

Referring to FIG. 8 and FIGS. 9A to 9E, where the second embodiment of the instant disclosure provides a method of manufacturing a multichip package structure for increasing the light-emitting efficiency and the light-projecting angle.

Figure 8:
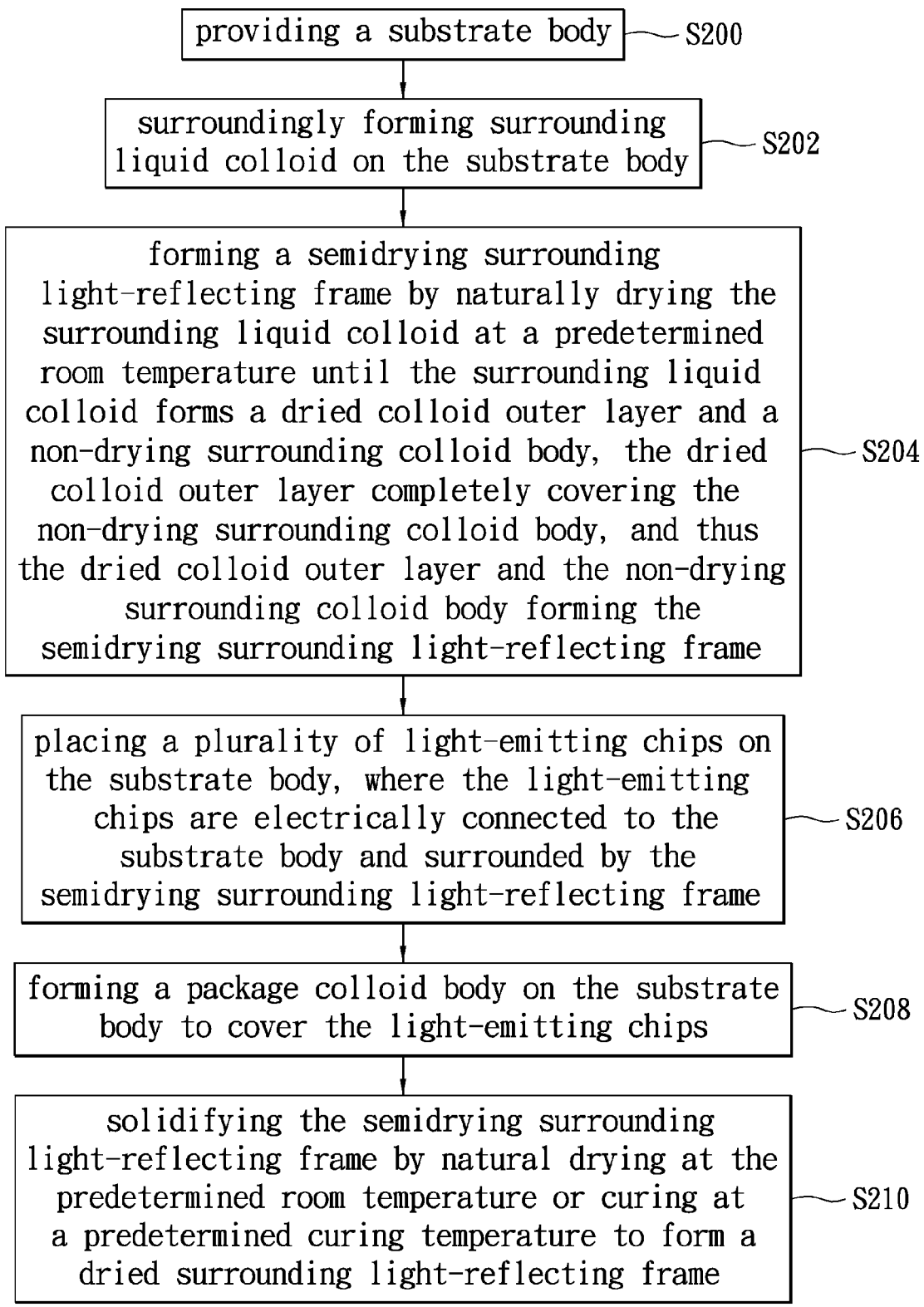
FIG. 8 shows a flowchart of the method of manufacturing a multichip package structure according to the second embodiment of the instant disclosure.

Referring to FIG. 8, the method of manufacturing a multichip package structure of the second embodiment of the instant disclosure, comprising the steps of: providing a substrate body (S200); surroundingly forming surrounding liquid colloid on the substrate body (S202); forming a semidrying surrounding light-reflecting frame by naturally drying the surrounding liquid colloid at a predetermined room temperature until the surrounding liquid colloid forms a dried colloid outer layer and a non-drying surrounding colloid body, the dried colloid outer layer completely covering the non-drying surrounding colloid body, and thus the dried colloid outer layer and the non-drying surrounding colloid body forming the semidrying surrounding light-reflecting frame (S204); placing a plurality of light-emitting chips on the substrate body, wherein the light-emitting chips are electrically connected to the substrate body and surrounded by the semidrying surrounding light-reflecting frame (S206); forming a package colloid body on the substrate body to cover the light-emitting chips, wherein the semidrying surrounding light-reflecting frame contacts and surrounds the package colloid body (S208); and then solidifying the semidrying surrounding light-reflecting frame by natural drying at the predetermined room temperature or curing at a predetermined curing temperature to form a dried surrounding light-reflecting frame (S210).

Figure 9A:
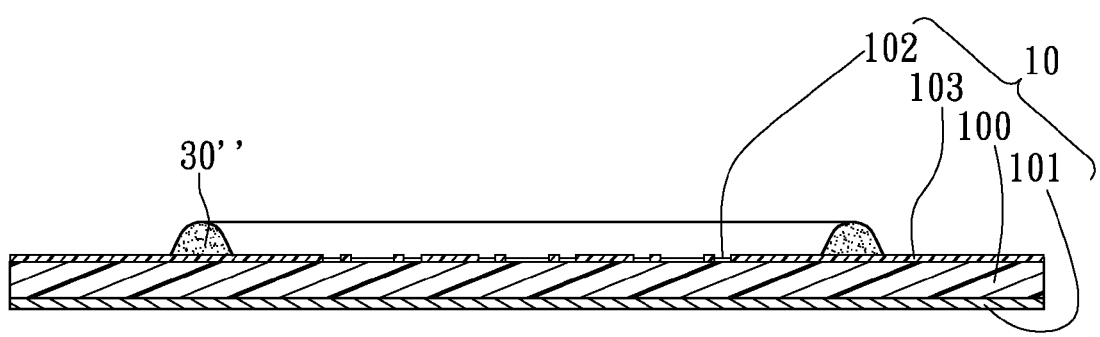
FIG. 9A shows a cross-sectional, schematic view of the step S200 and S202 according to the second embodiment of the instant disclosure.

Referring to FIGS. 8 and 9A, the method comprises: providing a substrate body 10 (step S200). For example, the substrate body 10 has a chip-mounting area (not shown) disposed on the top surface thereof, and the substrate body 10 has a circuit substrate 100, a heat-dissipating layer 101 disposed on the bottom surface of the circuit substrate 100, a plurality of conductive pads 102 disposed on the top surface of the circuit substrate 100, and an insulating layer 103 disposed on the top surface of the circuit substrate 100 to expose the conductive pads 102.

Figure 9B:
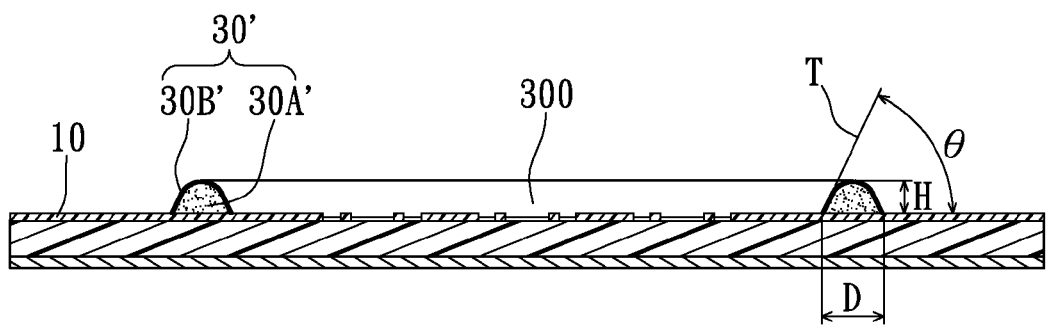
FIG. 9B shows a cross-sectional, schematic view of the step S204 according to the second embodiment of the instant disclosure.

Referring to FIGS. 8 and 9B, the method comprises: surroundingly forming surrounding liquid colloid 30" on the substrate body 10 (step S202), where the surrounding liquid colloid 30" can be formed as a predetermined shape (such as a circular shape, a square or a rectangular shape etc.) on the substrate body 10 by coating according to different requirements. The surrounding liquid colloid 30" can be surroundingly coated on the top surface of the substrate body 10 from an initial point to a terminal point, and the position of the initial point and the position of the terminal point are substantially the same.

Referring to FIGS. 8 and 9B, the method comprises: forming a semidrying surrounding light-reflecting frame 30' by naturally drying the surrounding liquid colloid 30" at a predetermined room temperature (such as 25° or 20°~30°) without any curing device until the surrounding liquid colloid 30" forms a dried colloid outer layer 30B'(such as surrounding solidifying colloid that is dried) and a non-drying surrounding colloid body 30A' (such as surrounding liquid colloid that is not to be dried), the dried colloid outer layer 30B' completely covering the non-drying surrounding colloid body 30A', and thus the dried colloid outer layer 30B' and the non-drying surrounding colloid body 30A' forming the semidrying surrounding light-reflecting frame 30'(step S204). For example, the semidrying surrounding light-reflecting frame 30'can be annularly extended from an initial point to a terminal point, and the position of the initial point and the position of the terminal point are substantially overlapping, thus the semidrying surrounding light-reflecting frame 30' has a convex or concave junction portion (not shown) formed on the top surface of the semidrying surrounding light-reflecting frame. Moreover, the semidrying surrounding light-reflecting frame 30' has an arc shape formed on the top surface of the semidrying surrounding light-reflecting frame. The semidrying surrounding light-reflecting frame 30' has a radius tangent T and the angle θ of the radius tangent T relative to the top surface of the substrate body 10 may be between 40° and 50°. The maximum height H of the semidrying surrounding light-reflecting frame 30' relative to the top surface of the substrate body 10 may be between 0.3 mm and 0.7 mm, and the width D of the bottom side of the semidrying surrounding light-reflecting frame 30' may be between 1.5 mm and 3 mm. The thixotropic index of the semidrying surrounding light-reflecting frame 30' may be between 4 and 6, and the semidrying surrounding light-reflecting frame 30'may be formed by mixing inorganic additive with white thermohardening colloid. In addition, the semidrying surrounding light-reflecting frame 30' surrounds the light-emitting chips 20 to form a colloid position limiting space 300 on the chip-mounting area 11 of the substrate body 10.

Figure 9C:
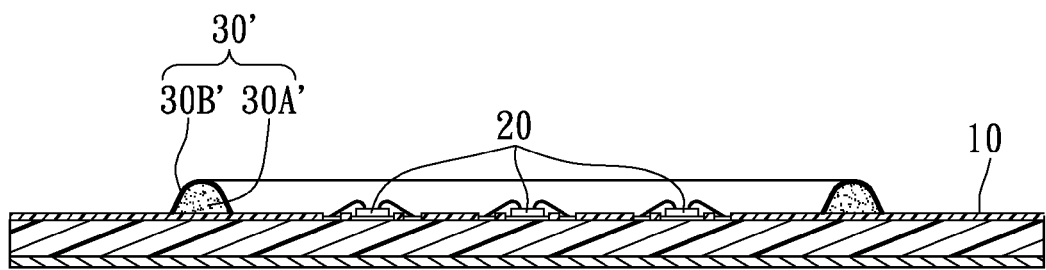
FIG. 9C shows a cross-sectional, schematic view of the step S206 according to the second embodiment of the instant disclosure.

Referring to FIGS. 8 and 9C, the method comprises: placing a plurality of light-emitting chips 20 on the substrate body 10, where the light-emitting chips 20 are electrically connected to the substrate body 10 and surrounded by the semidrying surrounding light-reflecting frame 30' (step S206). For example, each light-emitting chip may be a LED chip, and the light-emitting chips 20 can be electrically connected to the substrate body 10 by wire bonding.

Figure 9D:
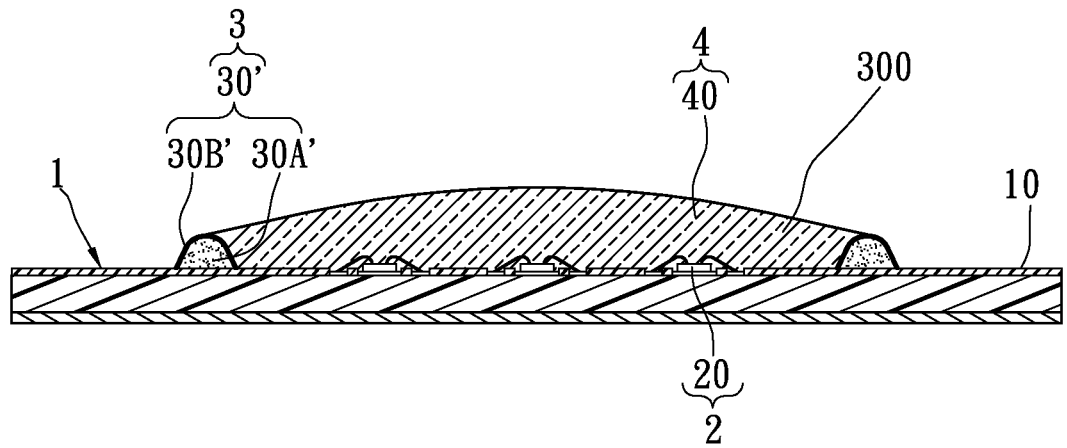
FIG. 9D shows a cross-sectional, schematic view of the step S208 according to the second embodiment of the instant disclosure.

Referring to FIGS. 8 and 9D, the method comprises: forming a package colloid body 40 on the substrate body 10 to cover the light-emitting chips 20, where the semidrying surrounding light-reflecting frame 30' contacts and surrounds the package colloid body 40 (step S208). For example, the package colloid body 40 may be a light-transmitting resin body inside the colloid position limiting space 300, and the package colloid body 40 has a convex top surface.

Hence, referring to FIG. 9D and the steps from S200 to S208, the second embodiment of the instant disclosure provides a multichip package structure for increasing the light-emitting efficiency and the light-projecting angle, comprising: a substrate unit 1, a light-emitting unit 2, a frame unit 3 and a package unit 4. The substrate unit 1 includes a substrate body 10. The light-emitting unit 2 includes a plurality of light-emitting chips 20 disposed on the substrate body 10 and electrically connected to the substrate body 10. The frame unit 3 includes a semidrying surrounding light-reflecting frame 30' surroundingly disposed on the substrate body 10. The light-emitting chips 20 are surrounded by the semidrying surrounding light-reflecting frame 30', and the semidrying surrounding light-reflecting frame 30' has a non-drying surrounding colloid body 30A' disposed on the substrate body 10 and a dried colloid outer layer 30B' totally covering the non-drying surrounding colloid body 30A'. The package unit 4 includes a package colloid body 40 disposed on the substrate body 10 to cover the light-emitting chips 20, and the semidrying surrounding light-reflecting frame 30' contacts and surrounds the package colloid body 40.

Figure 9E:
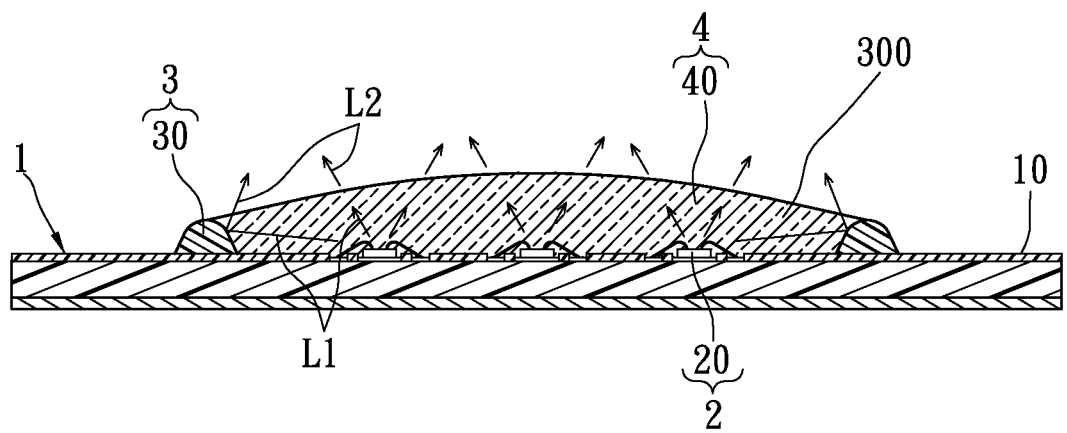
FIG. 9E shows a cross-sectional, schematic view of the step S210 according to the second embodiment of the instant disclosure.

Referring to FIGS. 8 and 9E, after the step of forming the package colloid body 40 (the step S208), the method further comprises: solidifying the semidrying surrounding light-reflecting frame 30' by natural drying at the predetermined room temperature or curing at a predetermined curing temperature to form a dried surrounding light-reflecting frame 30 (step S210). For example, in the first embodiment, each light-emitting chip 20 may be a blue LED chip, and the package colloid body 40 may be a phosphor resin body, thus blue light beams L1 generated by the light-emitting chips 20 (the blue LED chips) can pass through the package colloid body 40 (the phosphor resin body) to generate white light beams L2 that are similar to the light source generate by sun lamp.

Figure 10:
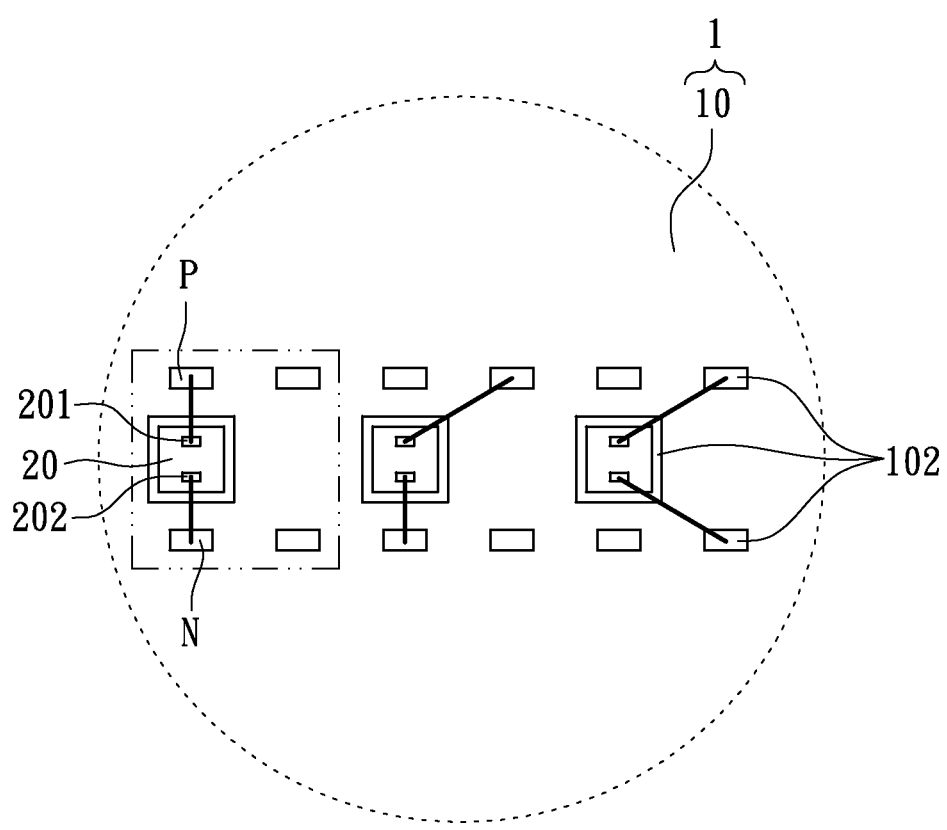
FIG. 10 shows a partial, top, schematic view of using a plurality of standby pads according to the instant disclosure.

Referring to FIG. 10, the substrate unit 1 includes a plurality of positive pads P disposed on the top surface of the substrate body 10 and a plurality of negative pads N disposed on the top surface of the substrate body 10. For the scope defined by the imaginary line in FIG. 10, each light-emitting chip 20 has a positive electrode 201 and a negative electrode 202, the positive electrode 201 of each light-emitting chip 20 corresponds to at least two of the positive pads P, and the negative electrode 202 of each light-emitting chip 20 corresponds to at least two of the negative pads N. In addition, the positive electrode 201 of each light-emitting chip 20 can be electrically connected to one of the two corresponding positive pads P by wire bonding, and the negative electrode 202 of each light-emitting chip 20 is electrically connected to one of the two corresponding negative pads N by wire bonding.

In conclusion, the semidrying surrounding light-reflecting frame 30' can be formed on the substrate body 10 without using any frame mold in the instant disclosure.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method of manufacturing a multichip package structure, comprising the steps of:

providing a substrate body;

surroundingly forming surrounding liquid colloid on the substrate body;

forming a semidrying surrounding light-reflecting frame by naturally drying the surrounding liquid colloid at a predetermined room temperature between 20° C.-30° C. until the surrounding liquid colloid forms a dried colloid outer layer and a non-drying colloid body without using any curing device, the dried colloid outer layer covering the non-drying colloid body, and the dried colloid outer layer and the non-drying colloid body forming the semidrying surrounding light-reflecting frame;

placing a plurality of light-emitting chips on the substrate body while the non-drying colloid body of the semidrying surrounding light-reflecting frame is naturally drying at the predetermined room temperature between 20° C.-30° C., wherein the light-emitting chips are electrically connected to the substrate body and surrounded by the semidrying surrounding light-reflecting frame;

forming a package colloid body on the substrate body to cover the light-emitting chips, while the non-drying colloid body of the semidrying surrounding light-reflecting frame is further naturally drying at the predetermined room temperature between 20° C.-30° C., wherein the semidrying surrounding light-reflecting frame contacts and surrounds the package colloid body; and after forming a package colloid body on the substrate body to cover the light-emitting chips, the non-drying colloid body of the semidrying surrounding light-reflecting frame is further naturally drying at the predetermined room temperature between 20° C.-30° C. until completely dried, and thus the semidrying surrounding light-reflecting frame becomes a dried surrounding light-reflecting frame, the dried surrounding light-reflecting frame being in a solid state;

wherein the semidrying surrounding light-reflecting frame has an arc shape formed on the top surface of the semidrying surrounding light-reflecting frame, the semidrying surrounding light-reflecting frame has a radius tangent and the angle of the radius tangent relative to the top surface of the substrate body is between 40° and 50°, the maximum height of the semidrying surrounding light-reflecting frame relative to the top surface of the substrate body is between 0.3 mm and 0.7 mm, the width of the bottom side of the semidrying surrounding light-reflecting frame is between 1.5 mm and 3 mm, the thixotropic index of the semidrying surrounding light-reflecting frame is between 4 and 6, and the semidrying surrounding light-reflecting frame is formed by mixing inorganic additive with white thermohardening colloid.

2. The method of claim 1, wherein the semidrying surrounding light-reflecting frame has a convex junction portion or a concave junction portion formed on the top surface of the semidrying surrounding light-reflecting frame.

3. The method of claim 1, wherein the semidrying surrounding light-reflecting frame is annularly extended from an initial point to a terminal point, and the position of the initial point and the position of the terminal point are substantially overlapping.

4. The method of claim 1, wherein the substrate unit includes a plurality of positive pads disposed on the top surface of the substrate body and a plurality of negative pads disposed on the top surface of the substrate body, wherein each light-emitting chip has a positive electrode and a negative electrode, the positive electrode of each light-emitting chip corresponds to at least two of the positive pads, and the negative electrode of each light-emitting chip corresponds to at least two of the negative pads.

5. The method of claim 4, wherein the positive electrode of each light-emitting chip is electrically connected to one of the two corresponding positive pads, and the negative electrode of each light-emitting chip is electrically connected to one of the two corresponding negative pads.

* * * * *